(12) United States Patent
Kropewnicki et al.

(10) Patent No.: US 7,799,678 B2
(45) Date of Patent: Sep. 21, 2010

(54) METHOD FOR FORMING A THROUGH SILICON VIA LAYOUT

(75) Inventors: Thomas J. Kropewnicki, Austin, TX (US); Ritwik Chatterjee, Austin, TX (US); Kurt H. Junker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 330 days.

(21) Appl. No.: 12/022,195

(22) Filed: Jan. 30, 2008

(65) Prior Publication Data

US 2009/0191708 A1 Jul. 30, 2009

(51) Int. Cl.
*H01L 21/44* (2006.01)
(52) U.S. Cl. ................ 438/667; 438/675; 257/E21.586
(58) Field of Classification Search ...................... 438/3, 438/239, 240, 253, 396, 667, 589, 637–642, 438/672, 659, 668, 669, 674–675, 700; 257/E21.031, 257/E21.586
See application file for complete search history.

(56) References Cited

U.S. PATENT DOCUMENTS 6,255,157 B1 * 7/2001 Hsu et al. ................... 438/239
6,924,551 B2 8/2005 Rumer et al.

2007/0132031 A1 6/2007 Shroff et al.

OTHER PUBLICATIONS

Warnat et al; "Design Rules for Post-CMOS Through Silicon Vias in an Industrial Environment"; 8th Electronics Packaging Technology Conference, 2006. EPTC '06. Dec. 6-8, 2006 pp. 35-39.

* cited by examiner

*Primary Examiner*—Charles D Garber
*Assistant Examiner*—Hoa B Trinh
(74) *Attorney, Agent, or Firm*—Daniel D. Hill

(57) ABSTRACT

A method for forming a TSV layout reduces recessing in a silicon nitride layer caused by forming the TSV through a silicon nitride layer having an intrinsic tensile stress or neutral stress. In one embodiment, the method includes compensating for the tensile stressed silicon nitride layer by either moving the TSV location to an area of intrinsic tensile stress, or by substituting a compressively stressed silicon nitride layer in the area of the TSV. The compressively stressed silicon nitride layer experiences less recessing during a TSV etch process than a silicon nitride layer under tensile stress. The smaller recesses are more readily filled when a dielectric liner is applied to the sidewalls of the TSV, reducing the possibility of voids being formed. Also, the smaller recesses require smaller exclusion zones, resulting in less surface area of an integrated circuit being used for the TSVs, as well as greater reliability and improved yields.

16 Claims, 5 Drawing Sheets

METHOD FOR FORMING A THROUGH SILICON VIA LAYOUT

BACKGROUND

1. Field

This disclosure relates generally to semiconductors, and more specifically, to a method for forming a through silicon via (TSV) layout on a semiconductor device.

2. Related Art

The use of through silicon vias (TSVs) allows the routing of signals through the substrate to the backside of a silicon semiconductor die. In some designs, a TSV can greatly reduce the length of conductors and thereby improve signal routing in an integrated circuit. Also, the implementation of TSVs on a semiconductor device can make stacked die arrangements more practical. However, there is a problem with forming a TSV on a semiconductor device that has undergone CMOS (complementary metal-oxide semiconductor) processing. On a CMOS integrated circuit, nitride may be used in various insulating layers, such as etch stop or passivation layers. TSV etching may create recesses in multilayer dielectric film stacks by laterally etching exposed nitride layers causing recesses. Unintentional recessing within or between the various layers of an integrated circuit structure is not desirable because the recess can cause layers above the recess to separate from each other, or delaminate, resulting in increased defectivity, reduced yields, and reliability. Also, the recess may become a void when the via is lined with a dielectric layer because the recess is too deep for the dielectric layer to fill. To reduce the defectivity, layout rules may include exclusion zones around TSVs. The layout rules may require that active circuitry not be formed within an exclusion zone to allow sufficient spacing from the TSVs to prevent the defectivity problem. However, using exclusion zones around TSVs increases the surface area of the integrated circuit and reduces the ability to scale integrate circuits to smaller sizes.

Therefore, what is needed is a methodology that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
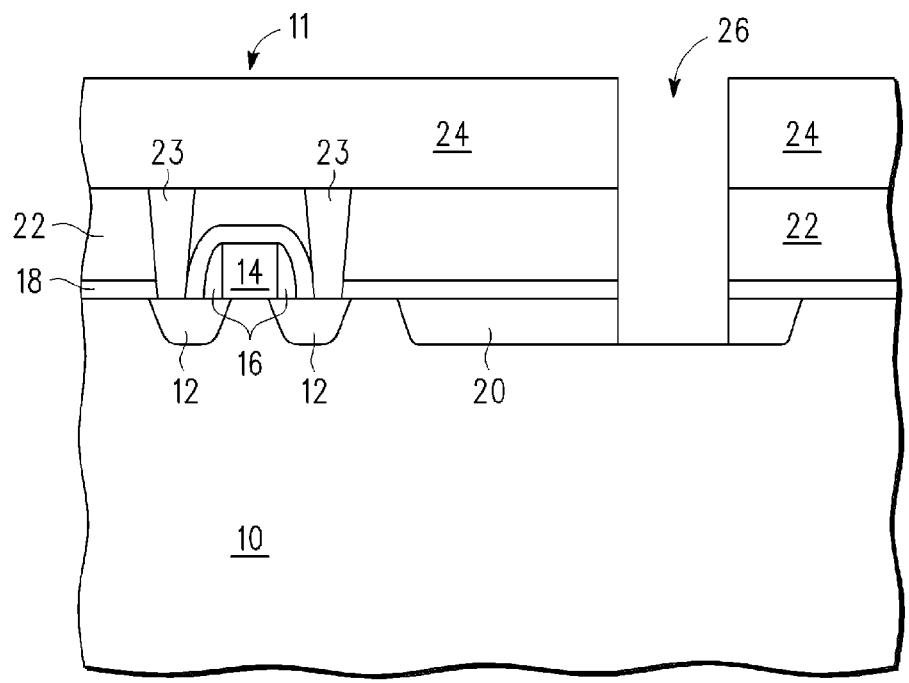
FIGS. 1-7 illustrate cross-sectional views of steps for making a semiconductor device in accordance with an embodiment.

Generally, the illustrated embodiment provides a method for forming a TSV layout that reduces recessing in a silicon nitride layer, where the recessing is caused by forming a TSV through a silicon nitride layer having an intrinsic tensile stress or neutral stress. The method includes compensating for the tensile stressed silicon nitride layer by substituting a compressively stressed silicon nitride layer in the area of the TSV. The compressively stressed silicon nitride layer experiences less recessing during a TSV etch process than a silicon nitride layer under tensile or neutral stress. The smaller recesses are more readily filled when a dielectric liner is applied to the sidewalls of the TSV, reducing the possibility of voids being formed. Also, the smaller recesses require smaller exclusion zones, resulting in less surface area of an integrated circuit being used for the TSVs, as well as greater reliability and improved yields.

In one aspect, there is provided, a method of forming a through substrate via comprising: providing a substrate having at least one transistor device, at least one insulating layer, and an interlevel dielectric (ILD) formed overlying the at least one insulating layer and the at least one transistor device; selecting a desired location of a through substrate via on the substrate; determining whether an insulating layer of the at least one insulating layer at the desired location is subject to forming a recess greater than a threshold amount during a subsequent reactive ion etching step for forming a portion of the through substrate via; implementing through substrate via compensation in response to a determination that the insulating layer of the at least one insulating layer at the desired location is subject to forming a recess greater that the threshold amount, wherein the through substrate via compensation includes one selected from the group consisting of (i) not forming the through substrate via at the desired location, (ii) relocating placement of the through substrate via from the desired location to another location, and (iii) locally replacing the insulating layer of the at least one insulating layer at the desired location with an insulating layer not subject to forming a recess greater than the threshold amount; forming an opening in the ILD and the at least one insulating layer at one of (i) the desired location and (ii) a location determined as a function of implementing the through substrate via compensation, wherein a portion of the at least one insulating layer at the desired location or at the location determined as a function of implementing the through substrate via compensation is exposed within the opening; etching the substrate with a reactive ion etch (RIE) to form a via portion of the through substrate via; forming a conformal dielectric liner overlying a top surface of the semiconductor substrate and within the via; and forming a conductive material within the via portion. In one embodiment, relocating placement of the through substrate via from the desired location to another location further comprises (ii)(a) a new location that includes an insulating layer not subject to forming a recess greater than the threshold amount, and (ii)(b) a new location in the insulating layer proximate the desired location but sufficiently distal from the desired location that formation of a void has minimal adverse impact on any transistor device performance. Also, for the new location that includes an insulating layer not subject to forming a recess greater than the threshold amount, the conformal dielectric liner may completely fill in any recess created within the insulating layer during the RIE etching to form the via portion. In addition, the threshold amount may correspond to any amount of recess sufficient for causing formation of a void subsequent to deposition of the conformal dielectric liner. Having the recess greater than or equal to the threshold amount prevents the conformal dielectric liner from completely filling in the recess, thereby forming the void. In one embodiment, the conductive material comprises a metal. The metal comprises one of copper, tungsten and alloys of the same. Also, the at least one insulating layer may include an intrinsic tensile stressed layer or an intrinsic compressive stressed layer. The substrate may comprise a semiconductor substrate. The semiconductor substrate may comprise silicon. The semiconductor substrate may further comprise a shallow trench isolation region and the via portion of the through substrate via may be formed through a portion of the shallow trench isolation region. The via portion of the through substrate via may comprise a blind via. The method may further comprise recessing a back surface of the substrate to expose a back surface portion of the through substrate via. The method may still further comprise etching the back surface of the substrate by an amount sufficient for causing the exposed back surface portion of the through substrate via to extend beyond the back surface.

In another aspect, there is provided, a method of forming a through substrate via comprising: providing a substrate having at least one transistor device, at least one insulating layer, and an interlevel dielectric (ILD) formed overlying the at least one insulating layer and the at least one transistor device, wherein the at least one insulating layer includes an intrinsic tensile stressed layer; selecting a desired location of a through substrate via on the substrate; determining whether an insulating layer of the at least one insulating layer at the desired location is subject to forming a recess greater than a threshold amount during a subsequent reactive ion etching step for forming a portion of the through substrate via; implementing through substrate via compensation in response to a determination that the insulating layer of the at least one insulating layer at the desired location is subject to forming a recess greater that the threshold amount, wherein the through substrate via compensation includes one selected from the group consisting of (i) not forming the through substrate via at the desired location, (ii) relocating placement of the through substrate via from the desired location to another location, and (iii) locally replacing the insulating layer of the at least one insulating layer at the desired location with an insulating layer not subject to forming a recess greater than the threshold amount, wherein relocating placement of the through substrate via from the desired location to another location further comprises (ii)(a) a new location that includes an insulating layer not subject to forming a recess greater than the threshold amount, and (ii)(b) a new location in the insulating layer proximate the desired location but sufficiently distal from the desired location that formation of a void has minimal adverse impact on any transistor device performance, further wherein for the new location that includes an insulating layer not subject to forming a recess greater than the threshold amount, the conformal dielectric liner completely fills in any recess created within the insulating layer during the RIE etching to form the via portion; forming an opening in the ILD and the at least one insulating layer at one of (i) the desired location and (ii) a location determined as a function of implementing the through substrate via compensation, wherein a portion of the at least one insulating layer at the desired location or at the location determined as a function of implementing the through substrate via compensation is exposed within the opening; etching the substrate with a reactive ion etch to form a via portion of the through substrate via; forming a conformal dielectric liner overlying a top surface of the semiconductor substrate and within the via, wherein the threshold amount corresponds to any amount of recess sufficient for causing formation of a void subsequent to deposition of the conformal dielectric liner, further wherein the recess greater than or equal to the threshold amount prevents the conformal dielectric liner from completely filling in the recess, thereby forming the void; and forming a conductive material within the via portion.

In yet another aspect, there is provided, a method of designing an integrated circuit layout requiring through substrate vias comprising: determining an initial placement of through substrate vias in the integrated circuit layout; and determining whether any through substrate vias are subject to recessing greater than a threshold amount, wherein responsive to a determination that through substrate vias are subject to recessing greater than a threshold amount, performing through substrate via compensation with respect to the corresponding through substrate vias, otherwise, accepting the initial placements of through substrate vias as final placements. In one embodiment, performing through substrate via compensation comprises implementing through substrate via compensation in response to a determination that an insulating layer, of at least one insulating layer at a desired location is subject to forming a recess greater that the threshold amount, wherein the through substrate via compensation includes one selected from the group consisting of (i) not forming the through substrate via at the desired location, (ii) relocating placement of the through substrate via from the desired location to another location, and (iii) locally replacing the insulating layer of the at least one insulating layer at the desired location with an insulating layer not subject to forming a recess greater than the threshold amount. Also, relocating placement of the through substrate via from the desired location to another location may further comprise (ii)(a) a new location that includes an insulating layer not subject to forming a recess greater than the threshold amount, and (ii)(b) a new location in the insulating layer proximate the desired location but sufficiently distal from the desired location that formation of a void has minimal adverse impact on any transistor device performance. In addition, for the new location that includes an insulating layer not subject to forming a recess greater than the threshold amount, a conformal dielectric liner may completely fill in any recess created within the insulating layer during RIE etching to form the via portion, and the threshold amount may correspond to any amount of recess sufficient for causing formation of a void subsequent to deposition of the conformal dielectric liner, further wherein the recess greater than or equal to the threshold amount prevents the conformal dielectric liner from completely filling in the recess, thereby forming the void.

FIGS. 1-7 illustrate cross-sectional views of steps for making a semiconductor device in accordance with an embodiment. FIG. 1 illustrates a cross-sectional view of a semiconductor device having a semiconductor substrate 10. In the illustrated embodiment, semiconductor substrate 10 is a silicon substrate. In another embodiment, substrate 10 may be another material. Active and passive circuit elements, such as transistor 11, are formed on a surface of the silicon substrate 10. The semiconductor device may include many transistors similar to representative transistor 11. Transistor 11 includes source/drain regions 12, a gate electrode 14 formed over a gate dielectric (not shown), and sidewall spacers 16 formed on sides of the gate electrode. In one embodiment, transistor 11 is formed using a conventional CMOS process and can be either an N-channel transistor or a P-channel transistor.

A shallow trench isolation (STI) region 20 is formed in the surface of substrate 10. A silicon nitride layer 18 is formed over substrate 10, transistor 11, and STI 20. In the illustrated embodiment, the silicon nitride layer 18 is used as a stressor layer and can be formed having an intrinsic tensile stress or an intrinsic compressive stress depending on the transistor type. An interlevel dielectric (ILD) layer 22 is formed over silicon nitride layer 18. Note that silicon nitride layer 18 may be one layer of a plurality, or stack, of insulating layers formed over substrate 10. The ILD layer 22 is patterned and source/drain contacts 23 are formed to contact source/drain regions 12. A hard mask layer 24 is formed over ILD 22. A location is selected for the TSV. The hard mask layer 24 is patterned and an initial opening 26 is formed using a reactive ion etch (RIE) in one embodiment. The initial opening 26 stops at substrate 10. As can be seen in FIG. 1, the initial opening 26 is formed through ILD 22, silicon nitride layer 18, and STI 20. In another embodiment, the location for the TSV may not be over an STI region.

Figure 2:
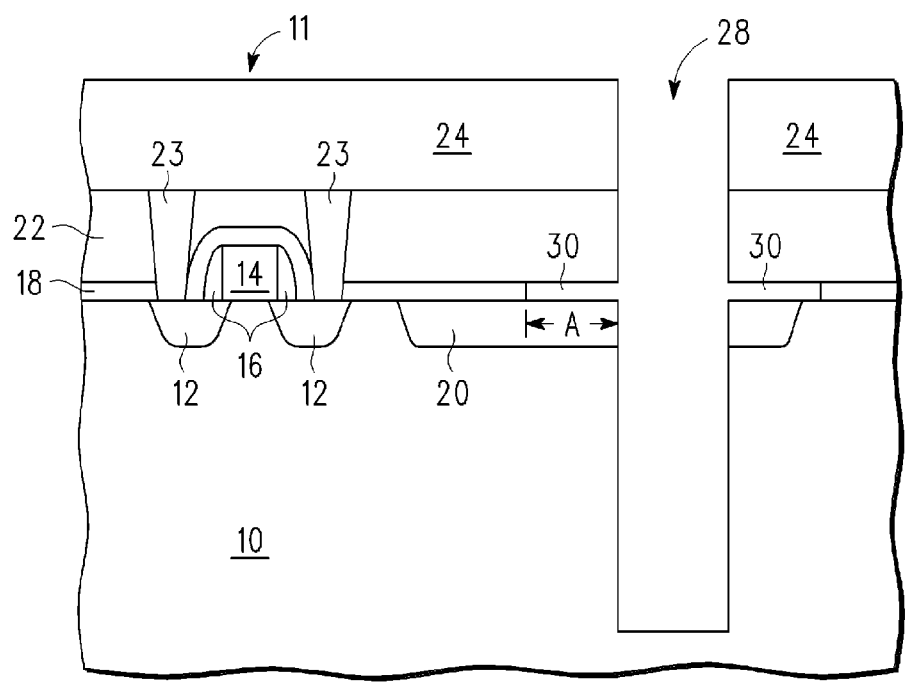

FIG. 2 illustrates a cross-sectional view of the semiconductor device of FIG. 1 after a via 28 is formed in substrate 10 in the initial opening 26. In the illustrated embodiment via 28 is a blind via, i.e., the etch process is stopped before via 28 goes completely through substrate 10. In other embodiments, via 28 may be etched completely through substrate 10. Also, in the illustrated embodiment, the etch process is a reactive ion etch. In other embodiments, via 28 may be formed with a different process. In FIG. 2, silicon nitride layer 18 is formed having an intrinsic tensile stress. Semiconductor processes for forming a stressed silicon nitride layer are known and will not be discussed further. Silicon nitride is commonly used as a stressor to apply a compressive stress or a tensile stress to underlying features. A silicon nitride layer formed to have an intrinsic compressive stress will cause an underlying layer to have a tensile stress. Likewise, a silicon nitride layer formed to have an intrinsic tensile stress will compressively stress an underlying layer. In one embodiment, the silicon nitride layer 18 is used to provide a tensile stress to the channel regions of N-channel transistors. The application of the appropriate type of stress to CMOS transistors has been found to enhance their performance. However, it has been discovered by the present inventors that silicon nitride layers having an intrinsic tensile stress incur more lateral recessing than silicon nitride layer having an intrinsic compressive stress when the silicon nitride is exposed to a TSV etch process. As illustrated in FIG. 2, the formation of via 28 causes lateral etching of tensile stressed silicon nitride layer 18 to form recesses 30. One of recesses 30 is illustrated having a length, or depth, of A. As an example, the length A for a recess in a tensile stressed silicon nitride layer 18 may be about 1.5 μm. The length A for other embodiments could be different. If recesses 30 are deeper than a threshold amount, the operation of the integrated circuit may be adversely affected. For example, the recess 30 may cause defects such as delamination and/or voids that adversely affect the operation of transistor 11.

Figure 3:
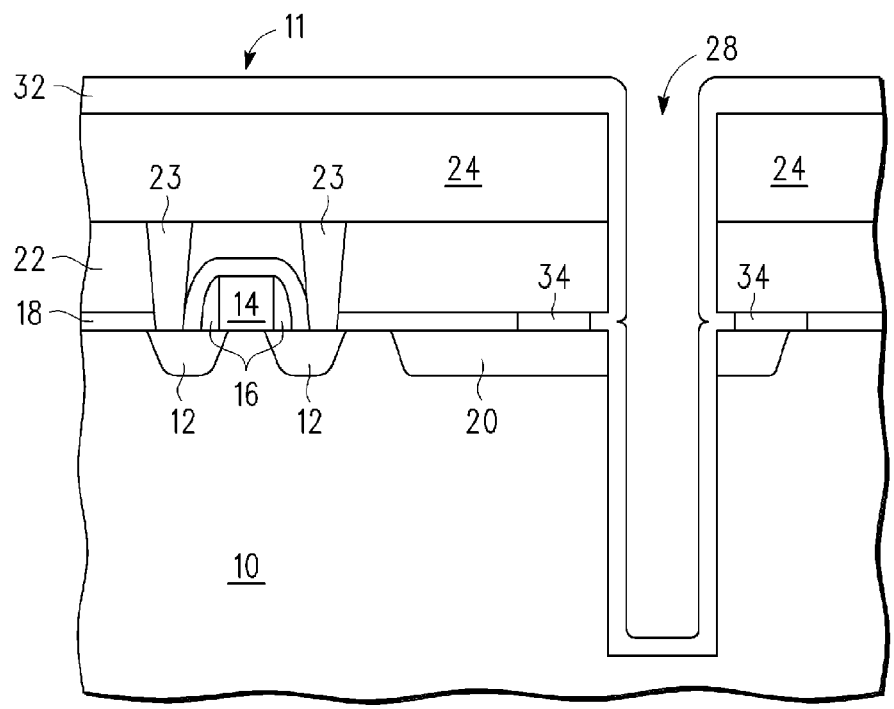

FIG. 3 illustrates a cross-sectional view of the semiconductor device of FIG. 2 after further processing. A conformal dielectric liner 32 is formed over mask layer 24 and on the sides of via 28. The dielectric liner 32 can be plasma enhanced nitride (PEN), nitride, oxide, or the like. As can be seen in FIG. 3, because recesses 30 are deeper than a threshold amount, the dielectric liner 32 cannot completely fill recesses 30, causing voids 34 to be formed. The voids are air spaces that may adversely affect the operation and/or performance of the integrated circuit.

Figure 4:
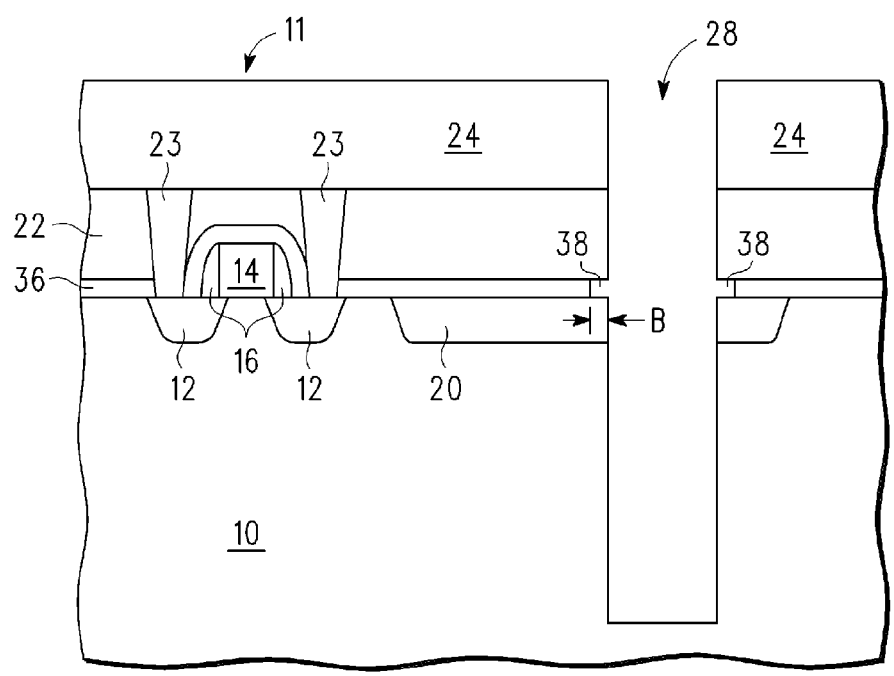

FIG. 4 illustrates a cross-sectional view of the semiconductor device of FIG. 1 after via 28 is formed in the substrate 10. FIG. 4 differs from FIG. 2 in that silicon nitride layer 36 has an intrinsic compressive stress in FIG. 4 instead of the intrinsic tensile stress illustrated in FIG. 2. As can be seen in FIG. 4, the compressively stressed silicon nitride layer 36 does not recess as much when via 28 is formed using the RIE process. Recesses 38 have a length, or depth, B, where B is less than A. As an example, length B may be about 400 nanometers (nm). As the intrinsic stress of the silicon nitride layer goes from being tensile to being compressive, the amount of recessing decreases. Increasing intrinsic compressive stress, or on the other hand, decreasing intrinsic tensile stress, causes the amount of recessing to be reduced. The threshold amount where voiding is substantially eliminated depends on, for example, the particular process used to form the silicon nitride layer, the thickness of the silicon nitride layer, and the fill process capability. The threshold amount corresponds to a depth, or length of recess that is sufficient for causing the formation of a void subsequent to deposition of the conformal dielectric liner. A recess greater than or equal to the threshold amount prevents the conformal dielectric liner from completely filling in the recess and thereby causing the void. As an example, the threshold amount may be an amount between about 500 nm and 50 nm. In one embodiment, the threshold amount is 200 nm, meaning that a particular conformal dielectric liner would fill all of the recess if the recess has a length of 200 nm or less. In another embodiment, the threshold amount is 500 nm, meaning that a particular conformal dielectric liner would fill all of the recess if the recess has a length of 500 nm or less. Other threshold amounts may be used in other embodiments.

Figure 5:
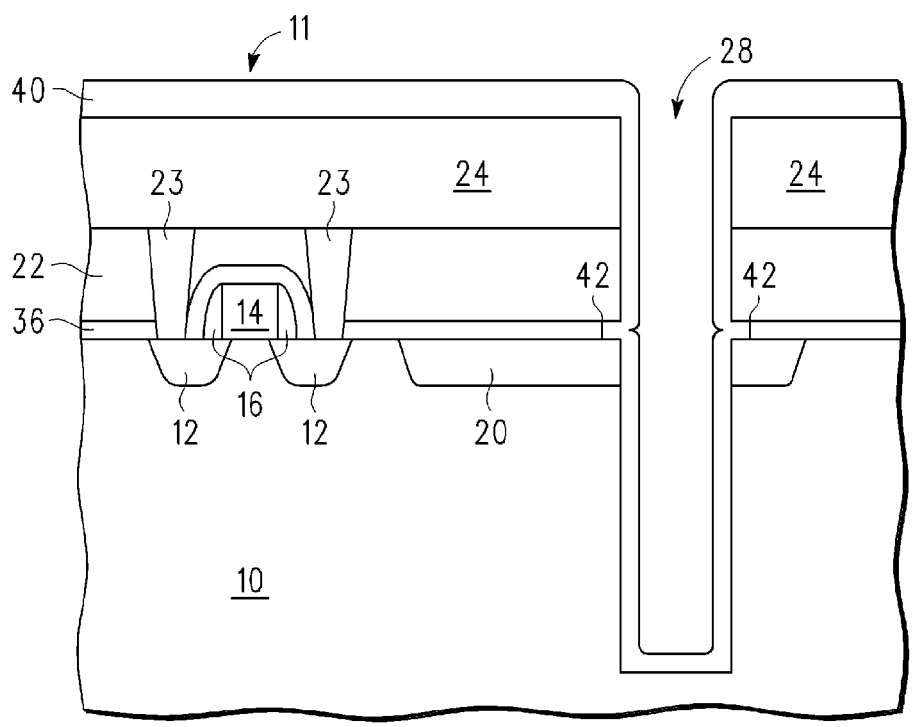

FIG. 5 illustrates a cross-sectional view of the semiconductor device of FIG. 4 after dielectric liner 40 is formed over hard mask 24 and on the sides of via 28. Because the depth B of recesses 38 is not as deep in silicon nitride layer 36 and is not greater than the threshold amount, a conformal dielectric liner 40 is formed without the creation of undesirable voids, as can be seen at junctions 42 between dielectric liner 40 and silicon nitride layer 36.

Figure 6:
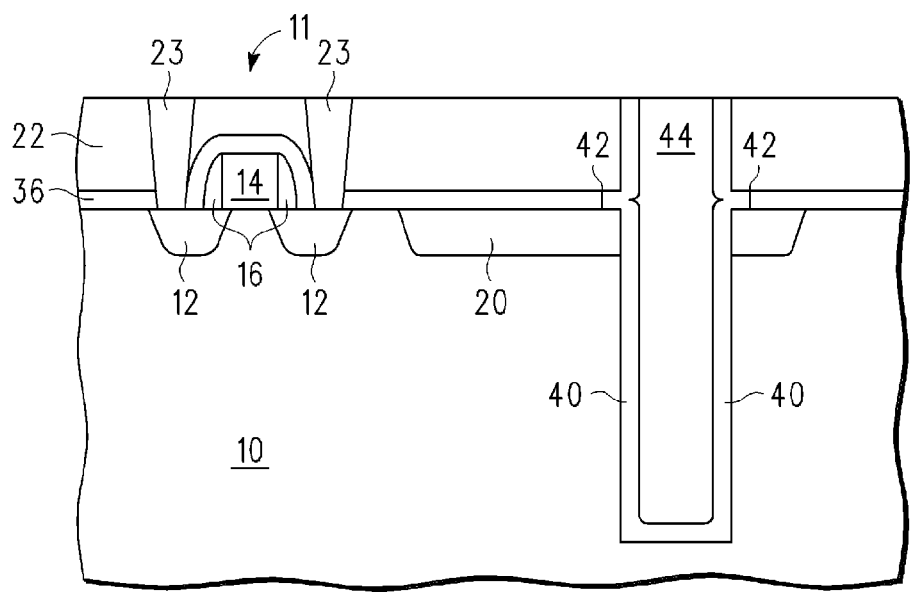

FIG. 6 illustrates a cross-sectional view of the device of FIG. 5 after via 28 is filled with a metal plug 44 comprising a metal such as copper, tungsten, alloys of copper or tungsten, or another conductive material. Dielectric liner 40, hard mask 24, and a portion of copper plug 44 are removed from above ILD 22. In one embodiment, dielectric liner 40 and hard mask 24 are removed using a chemical mechanical polishing process (CMP). In another embodiment, a wet etch or a combination of a wet etch and a CMP step can be used.

Figure 7:
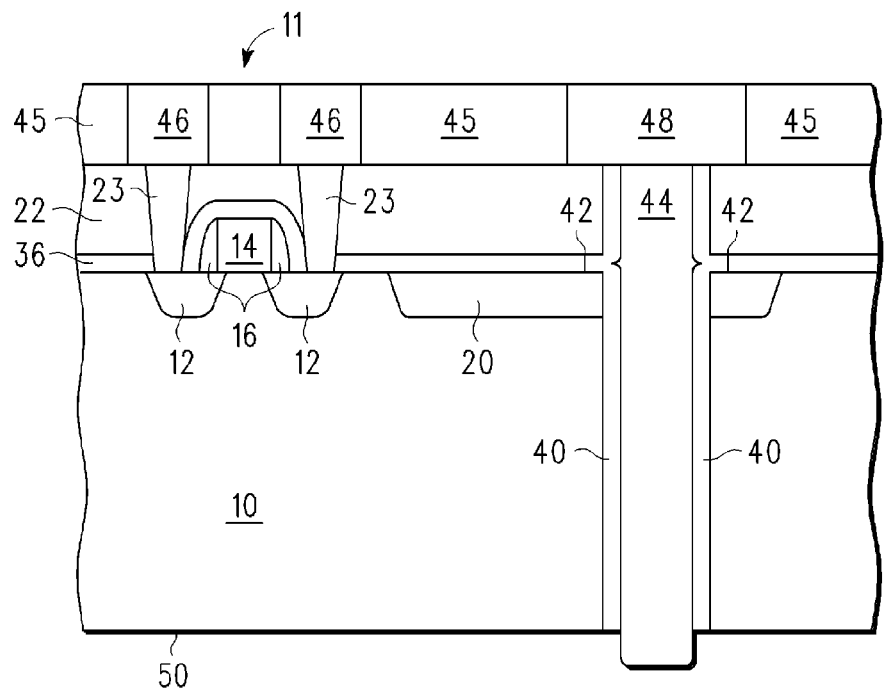

FIG. 7 illustrates a cross-sectional view of the device of FIG. 6 after further processing. In FIG. 7, source/drain metal interconnects 46 are formed on source/drain contacts 23. Also, a TSV metal interconnect 48 is formed on copper plug 44. In the illustrated layer, metal interconnects 46 and 48 are formed using copper in a first metal layer and insulated by an ILD layer 45. In another embodiment, the metal interconnects 46 and 48 may be formed in a different metal layer or may be formed in multiple metal layers. Also in FIG. 7, a back side 50 of substrate 10 is opposite the surface of substrate 10 having active circuitry. A planarization process such as CMP is used to remove, or recess, a portion of the backside of substrate 10 and copper plug 44. Then, an etch process or a selective etch process is used to remove, or recess, an additional portion of substrate 10 so that a portion of copper plug 44 is exposed. Note that in another embodiment, additional metal layers may be added over the first metal layer having interconnects 46 and 48.

To prevent the occurrence of voids when forming TSVs, a compensation process is used. If it is determined that a potential location for a TSV may result in recesses greater than the threshold amount, the compensation process includes either not forming the TSV at the desired location and relocating placement of the TSV from the desired location to another location, or locally replacing the silicon nitride insulating layer at the desired location with an insulating layer not subject to forming a recess greater than the threshold amount.

Figure 8:
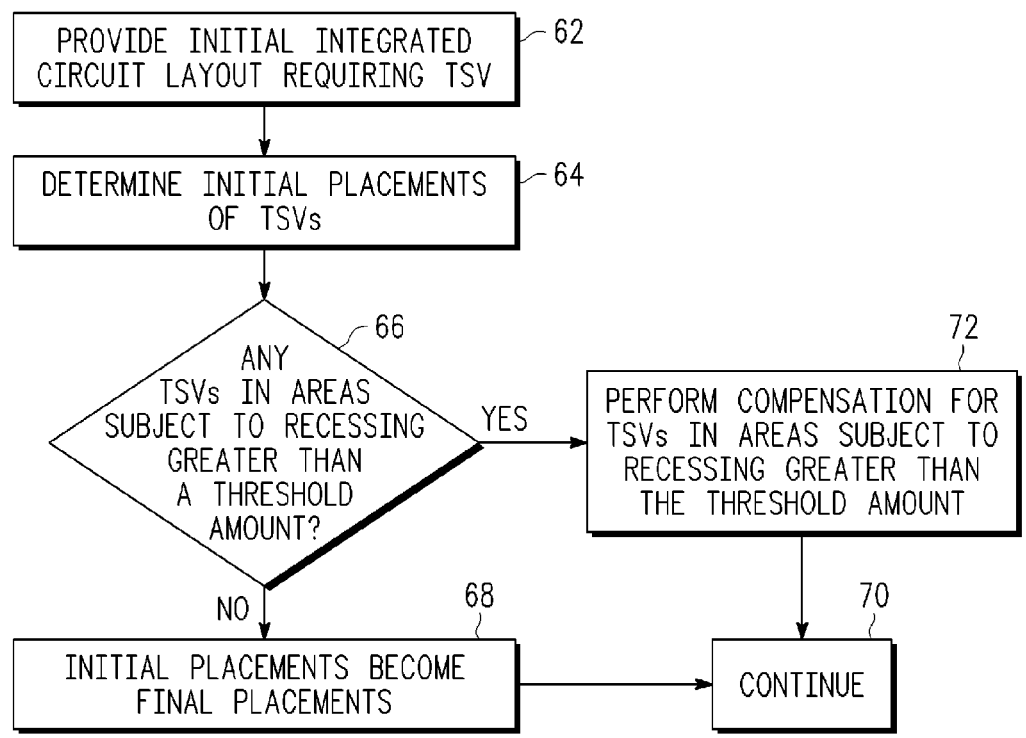
FIG. 8 illustrates a flow chart of a method for making a semiconductor device layout in accordance with an embodiment.

FIG. 8 illustrates a flow chart of a method for forming a layout 60 for making a semiconductor device layout in accordance with an embodiment. At step 62, an initial integrated circuit layout is provided that requires the placement of TSVs. The layout may be provided in a software layout tool that is executed on a computer system. At step 64, an initial placement of TSVs is determined. At decision step 66, it is determined if one or more TSVs are placed in areas that are subject to recessing greater than a threshold amount, where recessing refers to lateral etching of a silicon nitride layer as discussed above. In the illustrated embodiment, the amount of recessing increases as an intrinsic stress level goes from compressive to neutral and from neutral to tensile. If none of the TSVs are located in areas that are subject to recessing greater than the threshold amount, then the NO path is taken to step 68 and the initial placement of TSVs becomes the final placement. If a portion of the TSVs are located in areas that are subject to recessing greater than the threshold amount, then the YES path is taken to step 72. At step 72, a compensation step is performed to reduce the amount of tensile stress the portion of TSVs is subjected to. The probability of a recess over the threshold amount may be reduced by moving a TSV from an area of tensile stress to a compressively stressed area. Through experimentation, the probable length of a recess if a TSV is formed in a particular location is known. For example, an area of silicon nitride having intrinsic tensile stress will likely result in recesses above the threshold amount if a TSV is formed there. One way to reduce the size of a probable recess is to move the TSV to an area having a lower probability of recessing above the threshold amount. Typically, a new location should be proximate the initial desired location but sufficiently distal from the desired location that formation of a void has minimal adverse impact on any transistor device performance. Another way to reduce the size of a probable recess to below the threshold amount is by providing a local area at the initial location that has compressive stress instead of neutral or tensile stress (see FIG. 9 and the discussion below). The choice is determined by a number of factors including density of the integrated circuit features and availability of alternate placement locations. Therefore, the location of the TSV can be either the initial desired location or a location determined as a function of implementing the through substrate via compensation. After the probable recess amounts of all of the TSVs are changed to below the threshold amount, then the layout method continues at step 70 for additional processing, if necessary. In one embodiment, the method of FIG. 8 may be implemented in software and executed on a data processing system, such as for example, a computer system (not shown). The software may be in the form of a semiconductor layout tool.

Figure 9:
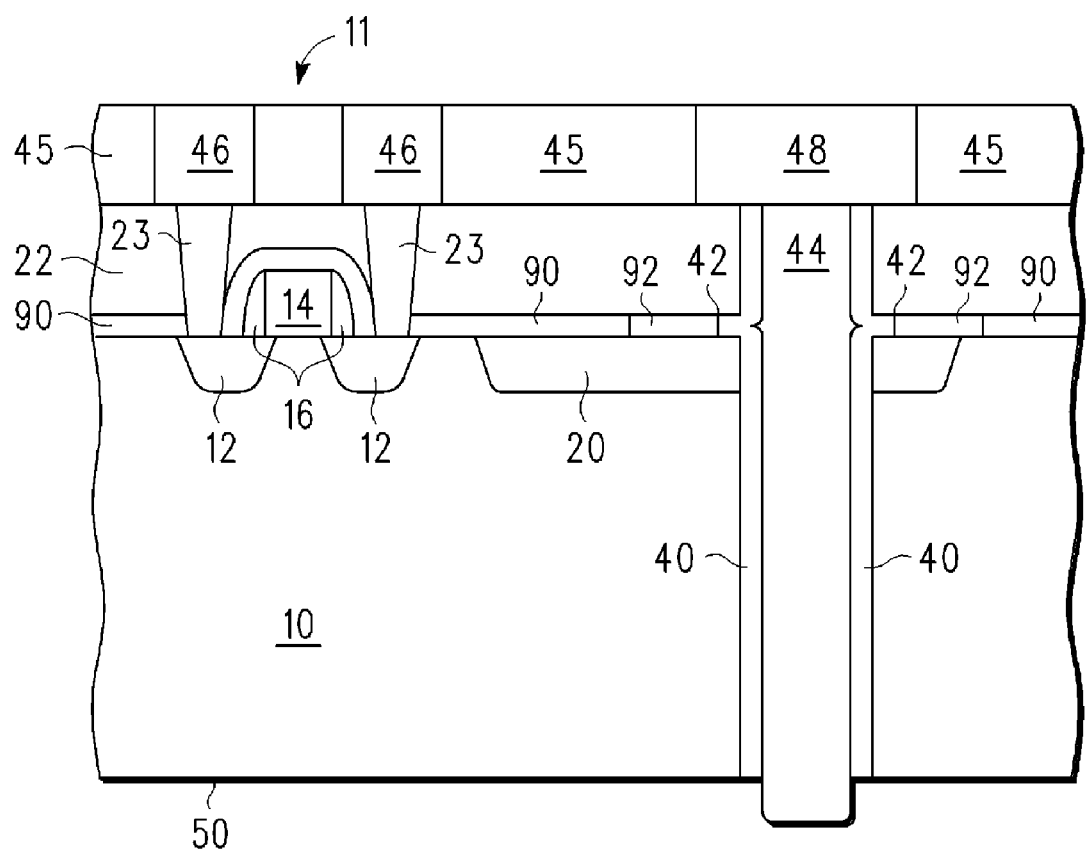
FIG. 9 illustrates a cross-sectional view of a semiconductor device in accordance with another embodiment.

FIG. 9 illustrates a cross-sectional view of a semiconductor device having a local compressive stress area for TSV placement. Generally, FIG. 9 is the same as FIG. 7 except that the semiconductor device of FIG. 9 includes a silicon nitride stressor layer 90 having tensile intrinsic stress instead of a compressively stressed layer 36 and a compressively stressed area 92 formed having a predetermined size sufficient to enclose the TSV comprising copper plug 44. This allows the TSV to be formed in an area having generally tensile stress by producing a small area of compressively stressed silicon nitride.

The substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of forming a through substrate via comprising:
providing a substrate having at least one transistor device, at least one insulating layer, and an interlevel dielectric (ILD) formed overlying the at least one insulating layer and the at least one transistor device;
selecting a desired location of a through substrate via on the substrate;
determining that an insulating layer of the at least one insulating layer at the desired location is subject to forming a recess greater than a threshold amount during a subsequent reactive ion etching step for forming a portion of the through substrate via;
implementing through substrate via compensation, wherein the through substrate via compensation includes one selected from the group consisting of (i) forming the through substrate via at the desired location, (ii) relocating placement of the through substrate via from the desired location to another location, and (iii) locally replacing the insulating layer of the at least one insulating layer at the desired location with an insulating layer not subject to forming a recess greater than the threshold amount;
forming an opening in the ILD and the at least one insulating layer at one of (i) the desired location and (ii) a location determined as a function of implementing the through substrate via compensation, wherein a portion of the at least one insulating layer at the desired location or at the location determined as a function of implementing the through substrate via compensation is exposed within the opening;

etching the substrate with a reactive ion etch to form a via portion of the through substrate via;

forming a conformal dielectric liner overlying a top surface of the semiconductor substrate and within the via; and forming a conductive material within the via portion.

2. The method of claim 1, wherein relocating placement of the through substrate via from the desired location to another location further comprises (ii)(a) a new location that includes an insulating layer not subject to forming a recess greater than the threshold amount, and (ii)(b) a new location in the insulating layer proximate the desired location but sufficiently distal from the desired location that formation of a void has minimal adverse impact on any transistor device performance.

3. The method of claim 2, further wherein for the new location that includes an insulating layer not subject to forming a recess greater than the threshold amount, the conformal dielectric liner completely fills in any recess created within the insulating layer during the RIE etching to form the via portion.

4. The method of claim 1, wherein the threshold amount corresponds to any amount of recess sufficient for causing formation of a void subsequent to deposition of the conformal dielectric liner.

5. The method of claim 4, further wherein the recess greater than or equal to the threshold amount prevents the conformal dielectric liner from completely filling in the recess, thereby forming the void.

6. The method of claim 1, wherein the conductive material comprises a metal.

7. The method of claim 6, further wherein the metal comprises one of copper, tungsten and alloys of the same.

8. The method of claim 1, wherein the at least one insulating layer includes an intrinsic tensile stressed layer.

9. The method of claim 1, wherein the at least one insulating layer includes an intrinsic compressive stressed layer.

10. The method of claim 1, wherein the substrate comprises a semiconductor substrate.

11. The method of claim 10, wherein the semiconductor substrate further comprises a shallow trench isolation region and wherein the via portion of the through substrate via is formed through a portion of the shallow trench isolation region.

12. The method of claim 10, further wherein the semiconductor substrate comprises silicon.

13. The method of claim 1, wherein the via portion of the through substrate via comprises a blind via.

14. The method of claim 13, further comprising recessing a back surface of the substrate to expose a back surface portion of the through substrate via.

15. The method of claim 14, still further comprising etching the back surface of the substrate by an amount sufficient for causing the exposed back surface portion of the through substrate via to extend beyond the back surface.

16. A method of forming a through substrate via comprising:

providing a substrate having at least one transistor device, at least one insulating layer, and an interlevel dielectric (ILD) formed overlying the at least one insulating layer and the at least one transistor device, wherein the at least one insulating layer includes an intrinsic tensile stressed layer;

selecting a desired location of a through substrate via on the substrate;

determining that an insulating layer of the at least one insulating layer at the desired location is subject to forming a recess greater than a threshold amount during a subsequent reactive ion etching step for forming a portion of the through substrate via;

implementing through substrate via compensation, wherein the through substrate via compensation includes one selected from the group consisting of (i) forming the through substrate via at the desired location, (ii) relocating placement of the through substrate via from the desired location to another location, and (iii) locally replacing the insulating layer of the at least one insulating layer at the desired location with an insulating layer not subject to forming a recess greater than the threshold amount, wherein relocating placement of the through substrate via from the desired location to another location further comprises (ii)(a) a new location that includes an insulating layer not subject to forming a recess greater than the threshold amount, and (ii)(b) a new location in the insulating layer proximate the desired location but sufficiently distal from the desired location that formation of a void has minimal adverse impact on any transistor device performance, further wherein for the new location that includes an insulating layer not subject to forming a recess greater than the threshold amount, the conformal dielectric liner completely fills in any recess created within the insulating layer during the RIE etching to form the via portion;

forming an opening in the ILD and the at least one insulating layer at one of (i) the desired location and (ii) a location determined as a function of implementing the through substrate via compensation, wherein a portion of the at least one insulating layer at the desired location or at the location determined as a function of implementing the through substrate via compensation is exposed within the opening;

etching the substrate with a reactive ion etch to form a via portion of the through substrate via;

forming a conformal dielectric liner overlying a top surface of the semiconductor substrate and within the via, wherein the threshold amount corresponds to any amount of recess sufficient for causing formation of a void subsequent to deposition of the conformal dielectric liner, further wherein the recess greater than or equal to the threshold amount prevents the conformal dielectric liner from completely filling in the recess, thereby forming the void; and forming a conductive material within the via portion.

* * * * *